(12) United States Patent
Kinsman et al.

(10) Patent No.: US 7,125,749 B2
(45) Date of Patent: Oct. 24, 2006

(54) VARIED-THICKNESS HEAT SINK FOR INTEGRATED CIRCUIT (IC) PACKAGES AND METHOD OF FABRICATING IC PACKAGES

(75) Inventors: Larry D. Kinsman, Boise, ID (US); Jerry M. Brooks, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/302,588

(22) Filed: Nov. 22, 2002

(65) Prior Publication Data

US 2003/0077853 A1 Apr. 24, 2003

Related U.S. Application Data

(63) Continuation of application No. 09/538,685, filed on Mar. 30, 2000, now Pat. No. 6,506,629, which is a continuation of application No. 08/887,381, filed on Jul. 2, 1997, now Pat. No. 6,159,764.

(51) Int. Cl.
*H01L 21/58* (2006.01)
*H01L 21/60* (2006.01)

(52) U.S. Cl. ..................................... 438/122
(58) Field of Classification Search ................ 438/122; 257/712

See application file for complete search history.

(56) References Cited

U.S. PATENT DOCUMENTS

| | | | |
|---|---|---|---|
| 4,024,570 A | 5/1977 | Hartmann et al. | |
| 4,594,641 A | 6/1986 | Hernandez | |
| 4,628,411 A | 12/1986 | Balderes et al. | |
| 4,868,635 A | 9/1989 | Frechette et al. | |
| 4,937,656 A | 6/1990 | Kohara | |
| 4,950,427 A | 8/1990 | Endo | |
| 5,012,323 A | 4/1991 | Farnworth | |
| 5,049,976 A | 9/1991 | Demmin et al. | |
| 5,089,878 A | 2/1992 | Lee | |
| 5,113,240 A | 5/1992 | Bozzini et al. | |
| 5,150,194 A | 9/1992 | Brooks et al. | |
| 5,193,053 A | 3/1993 | Sonobe | |
| 5,200,809 A * | 4/1993 | Kwon | 257/707 |
| 5,214,845 A | 6/1993 | King et al. | |
| 5,221,858 A | 6/1993 | Higgins, III | |
| 5,227,663 A | 7/1993 | Patil et al. | |
| 5,233,220 A | 8/1993 | Lamson et al. | |
| 5,276,352 A | 1/1994 | Komenaka et al. | |
| 5,287,000 A | 2/1994 | Takahashi et al. | |
| 5,299,092 A * | 3/1994 | Yaguchi et al. | 361/728 |
| 5,305,186 A | 4/1994 | Appelt et al. | |
| 5,343,074 A | 8/1994 | Higgins, III et al. | |
| 5,378,924 A | 1/1995 | Liang | |
| 5,379,187 A | 1/1995 | Lee et al. | |

(Continued)

*Primary Examiner*—Stephen W. Smoot
(74) *Attorney, Agent, or Firm*—TraskBritt

(57) ABSTRACT

An integrated circuit package includes a package body, such as a transfer molded plastic or preformed ceramic package body, having an integrated circuit die positioned therein. A lead frame, such as a peripheral lead, Leads-Over-Chip (LOC), or Leads-Under-Chip (LUC) lead frame, includes a plurality of leads with portions enclosed within the package body that electrically connect to the integrated circuit die. A heat sink is positioned at least partially within the package body so a surface of a first portion of the heat sink faces the lead frame in close proximity to a substantial part, such as at least eighty percent, of the area of the enclosed portion of the lead frame to thereby substantially reduce an inductance associated with each of the leads.

7 Claims, 2 Drawing Sheets

U.S. PATENT DOCUMENTS

| | | |
|---|---|---|
| 5,387,554 A | 2/1995 | Liang |
| 5,396,701 A | 3/1995 | Russell |
| 5,436,500 A * | 7/1995 | Park et al. .................. 257/696 |
| 5,444,602 A * | 8/1995 | Banerjee et al. ............ 361/705 |
| 5,483,098 A | 1/1996 | Joiner, Jr. |
| 5,498,901 A | 3/1996 | Chillara et al. |
| 5,508,556 A | 4/1996 | Lin |
| 5,530,295 A * | 6/1996 | Mehr ......................... 257/796 |
| 5,541,446 A | 7/1996 | Kierse |
| 5,559,306 A | 9/1996 | Mahulikar |
| 5,576,246 A * | 11/1996 | Conru et al. .................. 29/827 |
| 5,583,377 A | 12/1996 | Higgins, III |
| 5,589,420 A | 12/1996 | Russell |
| 5,594,282 A | 1/1997 | Otsuki |
| 5,596,231 A | 1/1997 | Combs |
| 5,598,034 A | 1/1997 | Wakefield |
| 5,648,681 A | 7/1997 | Takashima et al. |
| 5,659,200 A * | 8/1997 | Sono et al. .................. 257/713 |
| 5,686,361 A * | 11/1997 | Ootsuki ...................... 438/118 |
| 5,696,031 A | 12/1997 | Wark |
| 5,701,034 A | 12/1997 | Marrs |
| 5,719,442 A | 2/1998 | Otsuki |
| 5,736,785 A | 4/1998 | Chiang et al. |
| 5,805,513 A | 9/1998 | Takahashi et al. |
| 5,872,395 A | 2/1999 | Fujimoto |
| 5,955,777 A | 9/1999 | Corisis et al. |
| 5,977,626 A | 11/1999 | Wang et al. |
| 5,982,027 A | 11/1999 | Corisis |
| 6,025,640 A | 2/2000 | Yagi et al. |
| 6,133,622 A | 10/2000 | Corisis et al. |
| 6,159,764 A | 12/2000 | Kinsman et al. |
| 6,184,575 B1 * | 2/2001 | Chillara et al. ............. 257/692 |

* cited by examiner

VARIED-THICKNESS HEAT SINK FOR INTEGRATED CIRCUIT (IC) PACKAGES AND METHOD OF FABRICATING IC PACKAGES

CROSS-REFERENCE TO RELATED APPLICATIONS

This application is a continuation of application Ser. No. 09/538,685, filed Mar. 30, 2000, now U.S. Pat. No. 6,506,629, issued Jan. 14, 2003, which is a continuation of application Ser. No. 08/887,381, filed Jul. 2, 1997, now U.S. Pat. No. 6,159,764, issued Dec. 12, 2000. This application is related to an application entitled "LEAD FRAME ASSEMBLIES WITH VOLTAGE REFERENCE PLANE AND IC PACKAGES INCLUDING SAME," filed Jul. 2, 1997, having Ser. No. 08/888,336, now U.S. Pat. No. 5,955,777, issued Sep. 21, 1999, and commonly assigned with the present application.

BACKGROUND OF THE INVENTION

1. Field of the Invention

The present invention relates in general to devices and methods for reducing lead inductance in integrated circuit (IC) packages and, more specifically, to heat sinks for reducing lead inductance in such packages, minimizing volume of heat sink material, enhancing retention of the heat sink in molded packages, and improving moldability of the package encapsulant.

2. State of the Art

Integrated circuit (IC) packages typically contain small, generally rectangular integrated circuits referred to as IC "dice" or "chips." These IC dice come in an almost infinite variety of forms, including, for example, Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice.

Packaged IC dice communicate with circuitry external to their packages through lead frames embedded in the packages. These lead frames generally include an assembly of leads that extend into the packages to connect to bond pads on the IC dice through thin wire bonds or other connecting means and extend from the packages to terminate in pins or other terminals that connect to the external circuitry. Exemplary conventional lead frames include paddle-type wire-bond lead frames, which include a central die support and leads which extend to the perimeter of IC dice and connect to the dice through thin wire bonds, Leads-Over-Chip (LOC) lead frames, having leads which extend over an IC die to attach to and support the die while being electrically connected to the die through wire bonds or other connecting means, and Leads-Under-Chip (LUC) lead frames, having leads which extend under an IC die to attach to and support the die from below while being connected to the die typically through wire bonds.

As with all conductors, the leads in lead frames have an inductance associated with them that increases as the frequency of signals passing through the leads increases. This lead inductance is the result of two interactions: the interaction among magnetic fields created by signal currents flowing to and from an IC die through the leads (known as "mutual" inductance); and the interaction between the magnetic fields created by the signal currents flowing to and from the IC die through the leads and magnetic fields created by oppositely directed currents flowing to and from ground (known as "self" inductance).

While lead inductance in IC packages has not traditionally been troublesome because traditionally slow signal frequencies have made the inductance relatively insignificant, the ever-increasing signal frequencies of state of the art electronic systems have made lead inductance in IC packages significant. For example, overall performance of IC dice attached to leads in IC packages is slower than desirable because the inductance associated with the leads slows changes in signal current through the leads, causing signals to take longer to propagate through the leads. Also, digital signals propagating along the leads are dispersing (i.e., "spreading out") because the so-called "Fourier" components of various frequencies that make up the digital signals propagate through the inductance associated with the leads at different speeds, causing the components, and hence the digital signals themselves, to disperse along the leads. While mild dispersion merely widens the digital signals without detrimental effect, severe dispersion can make the digital signals unrecognizable upon receipt. In addition, so-called "reflection" signals propagating along the leads as a result of impedance mismatches between the leads and IC dice or the leads and external circuitry caused, in part, by the inductance associated with the leads can distort normal signals propagating along the leads at the same time as the reflection signals. Further, magnetic fields created by signal currents propagating through the inductance associated with the leads can induce currents in nearby leads, causing so-called "crosstalk" noise on the nearby leads. While these various effects can be troublesome in any electronic system, the modern trend toward 3.3 volt systems and away from 5.0 volt systems only serves to make these effects more noticeable and significant.

Prior IC packages have been configured in an attempt to reduce various effects of lead inductance as described above. For example, U.S. Pat. No. 5,214,845, assigned to the assignee of the present invention, employs a flexible, laminated sandwich assembly of an outer ground plane and an outer power plane dielectrically isolated from a series of conductive traces running therebetween. The traces and planes are connected to corresponding bond pads on an IC die at one end, and to leads on the other, as by thermocompression bonding (in the case of a TAB embodiment), or by wire bonds. Such an arrangement obviously doubles the number of required I/O connections by requiring two connections for each lead, and thus necessitates additional assembly time and increases the possibility of a faulty connection. Further, the flexible sandwich assembly constitutes an additional element of the package, increasing material cost.

Another approach to reducing the inductance effects described above is disclosed in U.S. Pat. No. 5,559,306, in which metal plates are employed above and below leads extending to the exterior of plastic and ceramic packages to effect reduction of self and mutual inductance. However, such configurations as disclosed appear to require relatively complex fabrication techniques to locate and fix the plates relative to the die and lead fingers or other conductors for subsequent transfer molding of a filled-polymer package thereabout, while the ceramic package embodiment is not cost-effective for high-volume, commercial packaging.

Accordingly, the inventors have recognized the need for a low-cost, reduced-inductance IC package configuration adaptable to current packaging designs and employing conventional and readily available materials, equipment and fabrication techniques.

SUMMARY OF THE INVENTION

An inventive integrated circuit (IC) package includes a package body, such as an extruded plastic or ceramic package body, having an IC die positioned therein. The IC die may be, for example, a Dynamic Random Access Memory (DRAM) die, a Static Random Access Memory (SRAM) die, a Synchronous DRAM (SDRAM) die, a Sequential Graphics Random Access Memory (SGRAM) die, a flash Electrically Erasable Programmable Read-Only Memory (EEPROM) die, or a processor die.

A lead frame, such as a conventional peripheral lead, Leads-Over-Chip (LOC), or Leads-Under-Chip (LUC) lead frame, includes a plurality of leads with portions enclosed within the package body that connect to the IC die. A heat sink is positioned at least partially within the package body so a surface of a first portion of the heat sink faces the lead frame in close proximity to a substantial part, such as at least 80 percent (80%), of the enclosed portion of each of the leads of the lead frame to thereby substantially reduce an inductance associated with each of the leads. The heat sink is preferably grounded so it acts as a ground plane for the leads, but it may also be electrically isolated, connected to a signal voltage, or connected to a reference voltage other than ground. A die-attach area on the surface of the first portion of the heat sink provides a support for the IC die, and a second portion of the heat sink is connected to the first portion substantially opposite the die-attach area and projects away from the first portion and the IC die to dissipate heat from the IC die.

The inventors have thus provided a low-cost, reduced-inductance IC package configuration adaptable to current packaging designs and employing conventional and readily available materials, equipment and fabrication techniques.

Another embodiment of the present invention is directed toward the heat sink of the previously summarized embodiment. Still another embodiment is directed to an electronic system including input, output, processor, and memory devices, and one of the devices includes the previously summarized IC package embodiment.

A further embodiment of the present invention comprises a method of making an IC package that includes providing a lead frame comprising a plurality of leads having portions for enclosure within the IC package. The enclosable portions of the leads of the lead frame are connected to an IC die, and an electrically conductive heat sink is positioned so a surface of a first portion of the heat sink faces the lead frame in close proximity to a substantial part of the enclosable portion of each of the leads of the lead frame to substantially reduce an inductance associated with each of the leads, so a die-attach area on the surface of the first portion may be attached to the IC die, and so a second portion of the heat sink connected to the first portion and substantially opposite the die-attach area projects away from the first portion and the IC die to dissipate heat from the IC die. The IC die is attached to the die-attach area on the surface of the first portion of the heat sink, and the enclosable portions of the leads of the lead frame, the IC die, and the heat sink are enclosed in the IC package.

A still further embodiment comprises a method of reducing an inductance associated with leads of a lead frame in an IC package. The leads have portions enclosed within the IC package and connected to an IC die. The method includes positioning an-electrically conductive heat sink within the IC package so a surface of the heat sink faces the lead frame in close proximity to at least about 80 percent (80%) of the enclosed portion of the lead frame.

An additional embodiment comprises a lead frame assembly that includes a lead frame and a heat sink positioned with a surface in a substantially mutually parallel and co-extensive relationship with, and in close but electrically insulated proximity to, the lead frame.

A still additional embodiment comprises a method for assembling an IC package, such as a Leads-Over-Chip (LOC) or Leads-Under-Chip (LUC) package, that includes an IC die. The method includes providing a lead frame that includes a plurality of leads having portions for enclosure within the IC package, and providing an electrically conductive heat sink enclosable at least partially within the IC package with a surface of a first portion of the heat sink facing the lead frame in close proximity to a substantial part of the enclosable portion of each of the leads of the lead frame, with a die-attach area on the surface of the first portion attachable to the IC die, and with a second portion of the heat sink projecting away from the first portion under the die-attach area. The lead frame is bonded to the heat sink, and the IC die is bonded to the die-attach area on the surface of the first portion of the heat sink. Also, the IC die is electrically connected to the leads of the lead frame, such as through wire bonds, and the heat sink is electrically connected to the lead frame.

A further embodiment comprises an IC package including a package body. An IC die is positioned within the package body along with portions of the leads of a lead frame that connect to the IC die. An electrically conductive heat sink is positioned at least partially within the package body with a vertically extending columnar portion surrounded by a horizontally extending skirt portion, and the skirt portion has a lead frame attachment surface proximate a die-attach surface substantially vertically aligned with the columnar portion. The lead frame attachment surface is attached to the lead frame and the die-attach surface is attached to the IC die.

DETAILED DESCRIPTION OF THE INVENTION

Figure 1A:
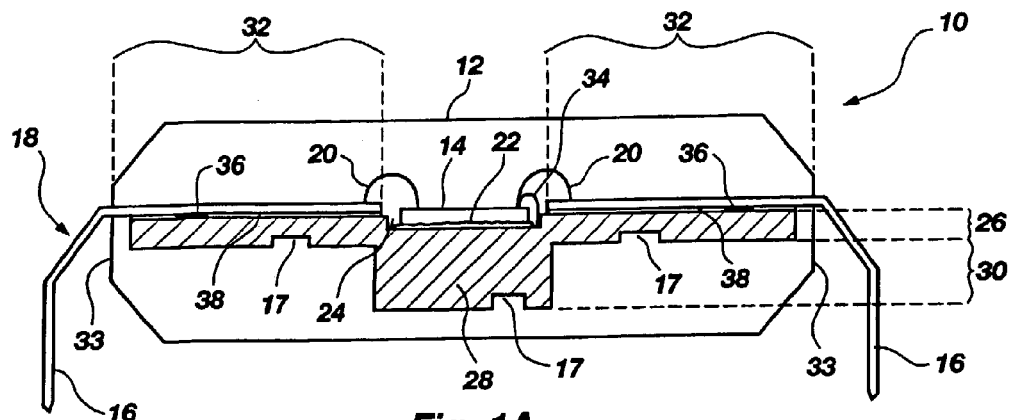
FIG. 1A is a cross-sectional side view of an integrated circuit (IC) package employing a heat sink to reduce lead inductance in the leads of a wire-bond lead frame in accordance with the present invention.

As shown in a cross-sectional side view in FIG. 1A, an integrated circuit (IC) package 10 in accordance with the present invention includes a package body 12 formed of encapsulating material having an IC die 14 therein. It will be understood by those having skill in the field of this invention that any package body of encapsulating material will work for purposes of the invention, including, for example, transfer-molded plastic package bodies and preformed ceramic package bodies. It will also be understood that the present invention will work in combination with any IC die, including, for example, a Dynamic Random Access Memory (DRAM) IC die, a Static Random Access Memory (SRAM) IC die, a Synchronous DRAM (SDRAM) IC die, a Sequential Graphics Random Access Memory (SGRAM) IC die, a flash Electrically Erasable Programmable Read-Only Memory (EEPROM) IC die, a processor IC die, or any other suitable IC die. It will further be understood that the IC package 10 may comprise any IC package, including, for example, a Small Outline J-lead (SOJ) package, a Thin Small Outline Package (TSOP), a Vertical Surface Mount Package (VSMP), a Quad Flat Pack (QFP) or a Thin QFP (TQFP).

Bond pads (not shown) on the IC die 14 are connected to leads 16 of a conventional paddle-type wire-bond lead frame 18 through wire bonds 20 so signals may pass between the IC die 14 and circuitry (not shown) external to the IC package 10 connected to the leads 16. Although the present embodiment will be described with respect to a wire-bonded, peripheral-lead finger lead frame, it will be understood that the present invention is applicable to any lead frame, including, for example, Leads-Over-Chip (LOC) and Leads-Under-Chip (LUC) lead frames, as will be described in more detail below with respect to FIGS. 1B and 1C. It will also be understood that the present invention is not limited to wire-bonded connections between leads of a lead frame and an IC die. Rather, the present invention includes within its scope all forms of connection between the leads of a lead frame and an IC die, including, for example, conventional Tape-Automated Bonding (TAB) connections, thermocompression bonding connections, and conductive adhesive connections.

The IC die 14 is attached by its backside through a heat-conductive material 22, such as a eutectic solder or an epoxy adhesive, to a die-attach area in a recess 24 in a surface of a first portion 26 of an electrically conductive heat sink 28 so heat from the IC die 14 may be transferred to the heat sink 28. A second portion 30 of the heat sink 28 projects away from the first portion 26 and the IC die 14 so heat transferred from the IC die 14 will more readily dissipate to the ambient environment outside the IC package 10.

By projecting away from the first portion 26 of the heat sink 28 in this manner, the second portion 30 of the heat sink 28 also "locks" the heat sink 28 firmly in place within the transfer molded filled encapsulant of package body 12. Locking holes 17 may be included in the heat sink 28 to receive the transfer molded encapsulant of the package body 12 and thereby further "lock" the heat sink 28 in place within the package body 12.

A conventional heat sink, like the one shown in U.S. Pat. No. 5,379,187, typically has difficulty "locking" in place within the transfer molded encapsulant of an IC package body because it generally comprises a single rectangular portion situated below an IC die which disrupts the even flow of encapsulant during manufacturing, causing the encapsulant to only loosely adhere to the heat sink. Such loose adherence between the encapsulant and a conventional heat sink in an IC package creates potential moisture paths between the package and its environment, and also makes the IC package more susceptible to cracking caused by moisture internal to the package.

In contrast, the heat sink 28 of the present invention includes the first portion 26 about which encapsulant may flow in a more even manner than with such conventional heat sinks. The first portion 26 also presents more surface area to which the encapsulant may adhere than the described conventional heat sinks. This increased adhesion or "locking" between the encapsulant and the heat sink 28 creates fewer potential moisture paths between the IC package 10 and its environment during manufacturing, and thereby makes the IC package 10 less susceptible to cracking caused by moisture internal to the IC package 10. These improvements are reflected in better performance by the heat sink 28 of the present invention in comparison to the described conventional heat sinks in the well-known preconditioned reflow test (PRT), commonly known as the "popcorn" test, which tests moisture intrusion in IC packages. The improvements are also reflected in better performance by the heat sink 28 of the present invention in the well known thermal cycling test, which tests IC packages for cracking mechanisms.

It will be understood that although the heat sink of the present embodiment is shown as having first and second portions integral with one another, the first and second portions of the heat sink, or the heat sink itself, may, instead, comprise a plurality of attached or interlocked parts, as will be described in more detail below with respect to FIGS. 1B and 1C. It will also be understood that although the second portion 30 of the heat sink 28 is shown as being generally rectangular, it can take any form that projects away from the first portion 26 and the IC die 14. It will further be understood that the second portion 30 of the heat sink 28 may extend beyond the exterior of the package body 12 of the IC package 10, as will be described below with respect to FIG. 1C.

The first portion 26 of the heat sink 28 extends beneath a substantial part of enclosed portions 32 of the leads 16 of the lead frame 18 in close proximity to the leads 16 but separated therefrom by an adhesive insulative layer 38, such as an adhesive tape or screen printed adhesive on the lead frame 18 or the heat sink 28. By extending in such close proximity to the leads 16, the first portion 26 of the heat sink 28 magnetically couples to the leads 16 and reduces the mutual and self inductance associated with the leads 16 as described above. The first portion 26 that extends beneath a "substantial part" of the enclosed portions 32 of the leads 16 includes, but is not limited to, those first portions that extend beneath substantially all of the enclosed portions 32 of the leads 16, that extend substantially to sides 33 of the IC package 10 as shown in FIG. 1A, and that, for example, extend beneath at least about eighty percent (80%) of the area of the enclosed portions 32 of the lead frame 18.

Those of skill in the field of this invention will recognize that the distance of the heat sink 28 from the leads 16, as well as the width of the heat sink 28, may be respectively decreased and increased to increase the effect of the heat sink 28 in reducing the inductance associated with the leads 16. Those of skill will also recognize that the heat sink 28 may be electrically isolated, or, preferably, may be connected to ground, another reference voltage, or a signal voltage through a wire bond 34 to the IC die 14 or through welds 36 between the leads 16 and the heat sink 28. Of course, it will also be understood that the heat sink 28 may be connected to a grounded backside surface of the IC die 14, and hence to ground, through an electrically conductive solder or die-attach epoxy (not shown) between the heat sink 28 and the IC die 14, and that the heat sink 28 may be connected to one or more of the leads 16, and hence to ground or a signal voltage, through an electrically conductive adhesive (not shown) between the leads 16 and the heat sink 28, as will be described below with respect to FIG. 1B.

Test results have shown that in one IC package in which the heat sink of the present invention is electrically isolated, lead inductance is reduced from that of a conventional, electrically isolated heat sink by about 18 percent (from about 4.95 nanohenries (nH) to about 4.05 nH). Such results have also shown that in another IC package in which the heat sink of the present invention is connected to a signal voltage, lead inductance is reduced from that of a conventional heat sink connected to a signal voltage by about 25 percent (from about 4.60 nH to about 3.47 nH). Finally, test results have shown that in yet another IC package in which the heat sink of the present invention is grounded, lead inductance is reduced from that of a conventional, grounded heat sink by about 50 percent (from about 3.98 nH to about 1.96 nH).

Figure 1B:
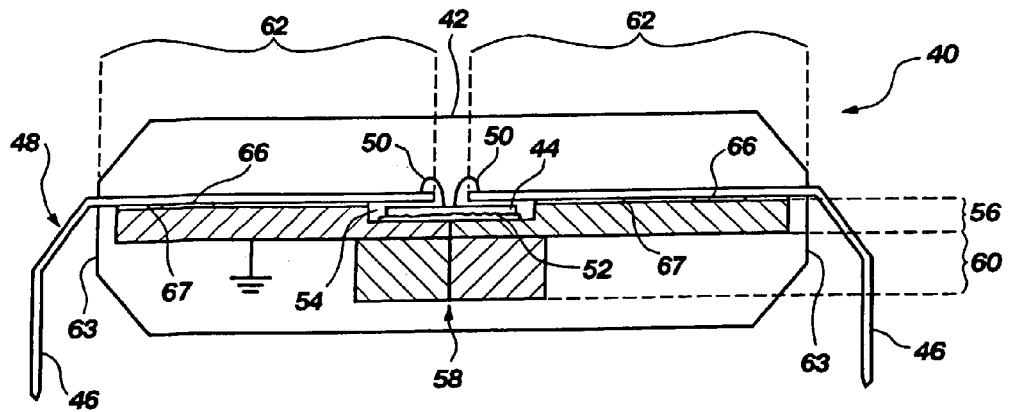
FIG. 1B is a cross-sectional side view of an IC package employing a heat sink to reduce lead inductance in the leads of a Leads-Over-Chip (LOC) lead frame in accordance with another embodiment of the present invention.

As shown in a cross-sectional side view in FIG. 1B, an IC package 40 in accordance with another embodiment of the present invention includes a package body 42 encapsulating an IC die 44. Bond pads (not shown) on the IC die 44 are connected to leads 46 of an LOC lead frame 48 through wire bonds 50 so signals may pass between the IC die 44 and circuitry (not shown) external to the IC package 40 connected to the leads 46. Although the present embodiment will be described with respect to an LOC lead frame, it will be understood that the present invention is applicable to any lead frame, including, for example, LUC lead frames, as will be described in more detail below with respect to FIG. 1C, and wire-bond lead frames, as was described above with respect to FIG. 1A.

The IC die 44 is attached through a heat-conductive and electrically conductive material 52, such as a solder or an epoxy adhesive, to a die-attach area in a recess 54 in a surface of a first portion 56 of an electrically conductive heat sink 58 so heat from the IC die 44 may be transferred to the heat sink 58. A second portion 60 of the heat sink 58 projects away from the first portion 56 and the IC die 44 so heat transferred from the IC die 44 will more readily dissipate to the ambient environment outside the IC package 40. By projecting away from the first portion 56 of the heat sink 58 in this manner, the second portion 60 of the heat sink 58 also "locks" the heat sink 58 firmly in place within the transfer molded IC package 40 in a manner undisclosed by prior heat sinks. It will be understood that although the heat sink of the present embodiment is shown as having first and second portions each comprising a plurality of attached or interlocked parts, the first and second portions of the heat sink may, instead, be integral with one another, as described above with respect to FIG. 1A. It will also be understood that although the second portion 60 of the heat sink 58 is shown as being generally rectangular, it can take any form that projects away from the first portion 56 and the IC die 44. It will further be understood that the second portion 60 of the heat sink 58 may extend outside the IC package 40, as will be described below with respect to FIG. 1C.

The first portion 56 of the heat sink 58 extends beneath a substantial part of enclosed portions 62 of the leads 46 of the lead frame 48 in close proximity to the leads 46 but separated therefrom by an insulative layer 67. By extending in such close proximity to the leads 46, the first portion 56 of the heat sink 58 magnetically couples to the leads 46 and thereby reduces the mutual and self inductance associated with the leads 46 as described above. The first portion 56 that extends beneath a "substantial part" of the enclosed portions 62 of the leads 46 includes, but is not limited to, those first portions that extend beneath substantially all of the enclosed portions 62 of the leads 46, that extend substantially to sides 63 of the IC package 40 as shown in FIG. 1B, and that extend beneath at least about eighty percent (80%) of the area of the enclosed portions 62 of the lead frame 48.

Those of skill in the field of this invention will recognize that the distance of the heat sink 58 from the leads 46, as well as the width of the heat sink 58, may be respectively decreased and increased to increase the effect of the heat sink 58 in reducing the inductance associated with the leads 46. Those of skill will also recognize that the heat sink 58 may be electrically isolated, or, preferably, may be connected to a grounded backside surface of the IC die 44, and hence to ground, through the electrically conductive material 52, or connected to a signal voltage or ground through a conductive adhesive 66 between the leads 46 and the heat sink 58.

Figure 1C:
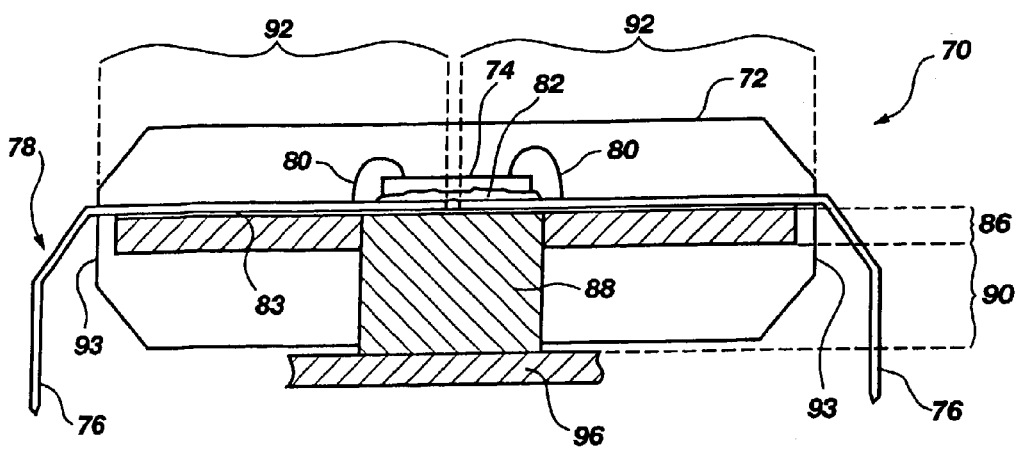
FIG. 1C is a cross-sectional side view of an IC package employing a heat sink to reduce lead inductance in the leads of a Leads-Under-Chip (LUC) lead frame in accordance with still another embodiment of the present invention.

As shown in a cross-sectional side view in FIG. 1C, an IC package 70 in accordance with still another embodiment of the present invention includes a package body 72 encapsulating an IC die 74. Bond pads (not shown) on the IC die 74 are connected to leads 76 of an LUC lead frame 78 through wire bonds 80 so signals may pass between the IC die 74 and circuitry (not shown) external to the IC package 70 connected to the leads 76.

The IC die 74 is attached through a heat-conductive material 82, such as a solder or an epoxy adhesive, to a die-attach area on the leads 76, and the leads 76 are in turn attached to a surface of a first portion 86 of an electrically conductive heat sink 88 through a heat-conductive layer 83 so heat from the IC die 74 may be transferred to the heat sink 88. A second portion 90 of the heat sink 88 projects away from the first portion 86 and the IC die 74 and outside the IC package 70 so heat transferred from the IC die 74 will more readily dissipate to the ambient environment outside the IC package 70. By projecting away from the first portion 86 of the heat sink 88 in this manner, the second portion 90 of the heat sink 88 also "locks" the heat sink 88 firmly in place within the IC package 70 in a manner undisclosed by prior heat sinks. It will be understood that although the heat sink of the present embodiment is shown as comprising a plurality of attached or interlocked parts, the heat sink may, instead, be an integral whole, as described above with respect to FIG. 1A. It will also be understood that although the second portion 90 of the heat sink 88 is shown as being generally rectangular, it can take any form that projects away from the first portion 86 and the IC die 74.

The heat sink 88 may be attached to a surface of a portion of a printed circuit board (PCB) 96, and may be grounded or connected to a signal or supply voltage through the attached portion of the PCB 96.

The first portion 86 of the heat sink 88 extends beneath a substantial part of enclosed portions 92 of the leads 76 of the lead frame 78 in close proximity to the leads 76 but separated therefrom by the heat conductive layer 83. By extending in such close proximity to the leads 76, the first portion 86 of the heat sink 88 magnetically couples to the leads 76 and thereby reduces the mutual and self inductance associated with the leads 76 as described above. The first portion 86 that extends beneath a "substantial part" of the enclosed portions 92 of the leads 76 includes, but is not limited to, those first portions that extend beneath substantially all of the enclosed portions 92 of the leads 76, that extend substantially to sides 93 of the IC package 70 as shown in FIG. 1C, and that extend beneath at least eighty percent (80%) of the enclosed portions 92 of the lead frame 78.

Those of skill in the field of this invention will recognize that the distance of the heat sink 88 from the leads 76, as well as the width of the heat sink 88, may be respectively decreased and increased to increase the effect of the heat sink 88 in reducing the inductance associated with the leads 76. Those of skill will also recognize that the heat sink 88 may be electrically isolated, or, preferably, may be connected to a signal voltage or ground as previously described.

Figure 2:
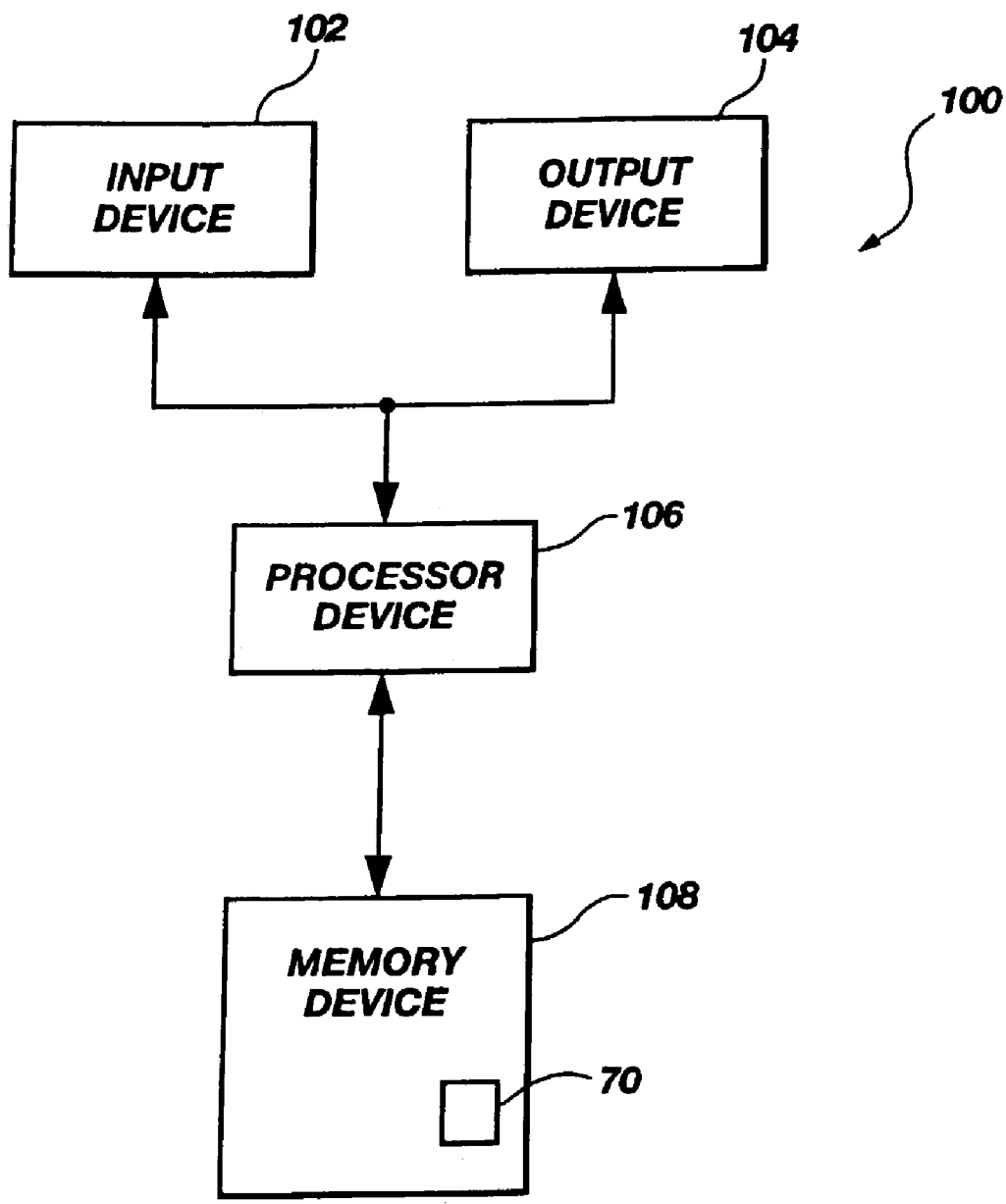
FIG. 2 is a block diagram of an electronic system including the IC package shown in FIG. IC.

As shown in a block diagram in FIG. 2, an electronic system 100 includes an input device 102, an output device 104, a processor device 106, and a memory device 108. The memory device 108 includes an IC package 70 as described above with respect to FIG. 1C, although it will, of course, be understood that the electronic system 100 may include any one of the IC packages of FIGS. 1A, 1B, and 1C in any one of the input, output, processor, and memory devices 102, 104, 106, and 108, respectively.

Although the present invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A manufacturing method for an integrated circuit package having at least one integrated circuit die therein having a first side having a plurality of bond pads thereon and a second side, having at least a portion of a lead frame having a plurality of leads, the plurality of leads having an enclosable portion for enclosure within the integrated circuit package, and having a heat sink having at least a portion thereof enclosable within the integrated circuit package, the manufacturing method comprising:

connecting the plurality of bond pads on the first side of the at least one integrated circuit die to the plurality of leads of the lead frame using a plurality of bond wires;

locating a heat sink having a surface having a first portion thereof facing portions of the lead frame located adjacent thereto, the heat sink having a substantial part of the enclosable portion of each lead of the plurality of leads of the lead frame located adjacent the surface of the first portion of the heat sink, the heat sink having a die-attach area on the surface of the first portion of the heat sink for attachment to the integrated circuit die, and the heat sink having a second portion thereof projecting away from the first portion of the heat sink under the die-attach area, the thickness of the first portion of the heat sink being less than the thickness of the second portion of the heat sink;

attaching at least a portion of the second side of the integrated circuit die to at least a portion of the die-attach area on the surface of the first portion of the heat sink using a heat conductive material for transferring heat from the integrated circuit die to the heat sink;

attaching at least a portion of the lead frame to at least a portion of the surface of the first portion of the heat sink, the heat sink positioned having the die-attach area on the surface of the first portion of the heat sink, the first portion of the heat sink extending beneath a substantial part of the enclosable portion of the plurality of leads of the lead frame in close proximity to the enclosable portion of the plurality of leads, the first portion of the heat sink extending beneath at least eighty percent of an area formed by the enclosable portion of a lead frame having a plurality of leads;

reducing the inductance of the plurality of leads of the lead frame by varying at least one of the distance between the heat sink from the plurality of leads of the lead frame and the width of the heat sink, the thickness of the first portion of the heat sink being less than the thickness of the second portion of the heat sink resulting in a reduction of inductance of about 18 percent over a heat sink of essentially uniform thickness;

connecting the enclosable portion of the plurality of leads of the lead frame to the integrated circuit die; and enclosing the enclosable portion of the plurality of leads of the lead frame, the integrated circuit die, and the enclosable portion of the heat sink in the integrated circuit package.

2. An assembly method for an integrated circuit package having an integrated circuit die having a plurality of bond pads, having a lead frame having a plurality of leads, the plurality of leads having an enclosable portion for enclosure within the integrated circuit package, and having a heat sink having a portion thereof enclosable within the integrated circuit package, the method comprising:

locating the heat sink enclosable at least partially within the integrated circuit package having a surface of a first portion of the heat sink facing the lead frame in close proximity to a substantial part of the enclosable portion of each of the plurality of leads of the lead frame, with a die-attach area on the surface of the first portion of the heat sink attachable to the integrated circuit die, and with a second portion of the heat sink projecting away from the first portion of the heat sink under the die-attach area;

bonding the lead frame to the heat sink using a heat conductive material for transferring heat from the integrated circuit die to the heat sink, the heat sink positioned having the die-attach area on the surface of the first portion of the heat sink, the first portion of the heat sink extending beneath a substantial part of the enclosable portion of said plurality of leads of the lead frame in close proximity to the enclosable portion of the plurality of leads, the first portion of the heat sink extending beneath at least eighty percent of an area formed by the enclosable portion of the lead frame having a plurality of leads;

bonding the integrated circuit die to the die-attach area on the surface of the first portion of the heat sink;

reducing the inductance of the plurality of leads of the lead frame by varying at least one of the distance between the heat sink from the plurality of leads of the lead frame, the size of the first portion of the heat sink, the thickness of the heat sink, and the width of the heat sink resulting in a reduction of inductance of about 18 percent over a heat sink of essentially uniform thickness;

electrically connecting the plurality of bond pads of the integrated circuit die to the plurality of the leads of the lead frame using a plurality of bond wires; and electrically connecting the heat sink to the lead frame.

3. An assembly method for a Leads-Over-Chip integrated circuit package having an integrated circuit die having a plurality of bond pads, having a lead frame that includes a plurality of leads, the plurality of leads having an enclosable portion for enclosure within the integrated circuit package, and having a heat sink having a portion thereof enclosed within the integrated circuit package, the method comprising:

locating a heat sink enclosable at least partially within the integrated circuit package having a surface of a first portion of the heat sink facing the lead frame in close proximity to a substantial part of the enclosable portion of the plurality of leads of the lead frame, with a die-attach area on the surface of the first portion of the heat sink attachable to the integrated circuit die, and with a second portion of the heat sink projecting away from the first portion of the heat sink under the die-attach area;

attaching the integrated circuit die to the lead frame;

reducing the inductance of the plurality of leads of the lead frame by varying at least one of the distance between the heat sink from the plurality of leads of the lead frame, the size of the first portion of the heat sink, the thickness of the heat sink, and the width of the heat sink resulting in a reduction of inductance of about 18 percent over a heat sink of essentially uniform thickness;

bonding the integrated circuit die to the die-attach area on the surface of the first portion of the heat sink, the heat sink positioned having the die-attach area on the surface of the first portion of the heat sink, the first portion of the heat sink extending beneath a substantial part of the enclosable portion of the plurality of leads of the lead frame in close proximity to the enclosable portion of the plurality of leads, the first portion of the heat sink extending beneath at least eighty percent of an area formed by the enclosable portion of the lead frame having a plurality of leads; and electrically connecting the plurality of bond pads of the integrated circuit die to the plurality of leads of the lead frame using a plurality of bond wires.

4. The assembly method of claim 3, wherein bonding the integrated circuit die to the die-attach area occurs before electrically connecting the integrated circuit die to the plurality of leads of the lead frame.

5. The assembly method of claim 3, wherein electrically connecting the integrated circuit die to the leads of the lead frame occurs before bonding the integrated circuit die to the die-attach area.

6. The assembly method of claim 3, wherein electrically connecting the integrated circuit die to the plurality of leads of the lead frame comprises wire bonding the integrated circuit die to the leads of the lead frame.

7. An assembly method for a Leads-Under-Chip integrated circuit package having an integrated circuit die having a plurality of bond pads, having a lead frame that includes a plurality of leads, the plurality of leads having an enclosable portion for enclosure within the integrated circuit package, and having a heat sink, the method comprising:

locating a heat sink enclosable at least partially within the integrated circuit package with a surface of a first portion of the heat sink facing the lead frame in close proximity to a substantial part of the enclosable portion of the plurality of leads of the lead frame, with a die-attach area on the surface of the first portion of the heat sink attachable to the integrated circuit, and with a second portion of the heat sink projecting away from the first portion of the heat sink under the die-attach area;

attaching the integrated circuit die to the lead frame;

reducing the inductance of the plurality of leads of the lead frame by varying at least one of the distance between the heat sink from the plurality of leads of the lead frame, the width of the heat sink, the size of the first portion of the heat sink, and the thickness of the heat sink resulting in a reduction of inductance of about 18 percent over a heat sink of essentially uniform thickness;

bonding the integrated circuit die to the die-attach area on the surface of the first portion of the heat sink, the heat sink positioned having the die-attach area on the surface of the first portion of the heat sink, the first portion of the heat sink extending beneath a substantial part of the enclosable portion of the plurality of leads of the lead frame in close proximity to the enclosable portion of the plurality of leads, the first portion of the heat sink extending beneath at least eighty percent of an area formed by the enclosable portion of the lead frame having a plurality of leads; and electrically connecting the plurality of bond pads of the integrated circuit die to the plurality of leads of the lead frame using a plurality of bond wires.

* * * * *

UNITED STATES PATENT AND TRADEMARK OFFICE
CERTIFICATE OF CORRECTION

PATENT NO. : 7,125,749 B2 Page 1 of 1
APPLICATION NO. : 10/302588
DATED : October 24, 2006
INVENTOR(S) : Larry D. Kinsman and Jerry M. Brooks It is certified that error appears in the above-identified patent and that said Letters Patent is hereby corrected as shown below:

In the specification:
| | | |
|---|---|---|
| COLUMN 2, | LINE 32, | change "modem" to --modern-- |
| COLUMN 4, | LINE 53, | change "FIG. IC." to --FIG. 1C.-- |
| COLUMN 7, | LINE 49, | change "FIG. IC." to --FIG. 1C.-- |

In the claims:
CLAIM 2, COLUMN 10, LINE 32, change "of said plurality" to --of the plurality--

Signed and Sealed this

Sixteenth Day of October, 2007

JON W. DUDAS
*Director of the United States Patent and Trademark Office*